(12) United States Patent
Stolze (10) Patent No.: US 7,919,854 B2
(45) Date of Patent: Apr. 5, 2011

(54) SEMICONDUCTOR MODULE WITH TWO COOLING SURFACES AND METHOD

(75) Inventor: Thilo Stolze, Arnsberg (DE)

(73) Assignee: Infineon Technologies AG, Neubiberg (DE)

( * ) Notice: Subject to any disclaimer, the term of this patent is extended or adjusted under 35 U.S.C. 154(b) by 246 days.

(21) Appl. No.: 12/192,496

(22) Filed: Aug. 15, 2008

(65) Prior Publication Data

US 2010/0038758 A1 Feb. 18, 2010

(51) Int. Cl.
*H01L 23/34* (2006.01)

(52) U.S. Cl. ........ 257/712; 257/713; 257/717; 257/720; 257/722; 257/E33.075; 257/E23.051; 257/E23.08; 257/E23.103; 257/E23.105; 438/122; 361/688; 361/702; 361/703; 361/709; 174/548

(58) Field of Classification Search .................. 257/276, 257/625, 675, 706, 707, 712–796, E33.075, 257/E31.131, E23.051, E23.08–E23.113; 438/122, FOR. 413; 361/688, 702–704, 709, 717, 719; 174/548

See application file for complete search history.

(56) References Cited

U.S. PATENT DOCUMENTS

| 4,918,511 | A * | 4/1990 | Brown .......................... 257/669 |
| 6,903,457 | B2 * | 6/2005 | Nakajima et al. ............. 257/717 |

FOREIGN PATENT DOCUMENTS

DE 102008033465 A1 1/2009

* cited by examiner

*Primary Examiner* — Jasmine J Clark
(74) *Attorney, Agent, or Firm* — Dicke, Billiq & Czaja, PLLC (57) ABSTRACT

A semiconductor module with two cooling surfaces and method. One embodiment includes a first carrier with a first cooling surface and a second carrier with a second cooling surface. The first cooling surface is arranged in a first plane, the second cooling surface is arranged in a second plane, at an angle different from 0° relative to the first plane.

21 Claims, 11 Drawing Sheets

SEMICONDUCTOR MODULE WITH TWO COOLING SURFACES AND METHOD

BACKGROUND

The invention relates to semiconductor modules. Semiconductor modules are used, inter alia, in power conversion technology, e.g., in inverters, or in power supply technology, e.g., for driving electric motors. As such modules produce waste heat, efficient cooling is required to avoid overheating.

In conventional semiconductor modules the semiconductor chips of the module are arranged on the top side of a common base plate. The bottom side of the base plate is in thermal contact with a heat sink. Due to increasing power densities of the semiconductor chips, there is a need for an improved cooling concept.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
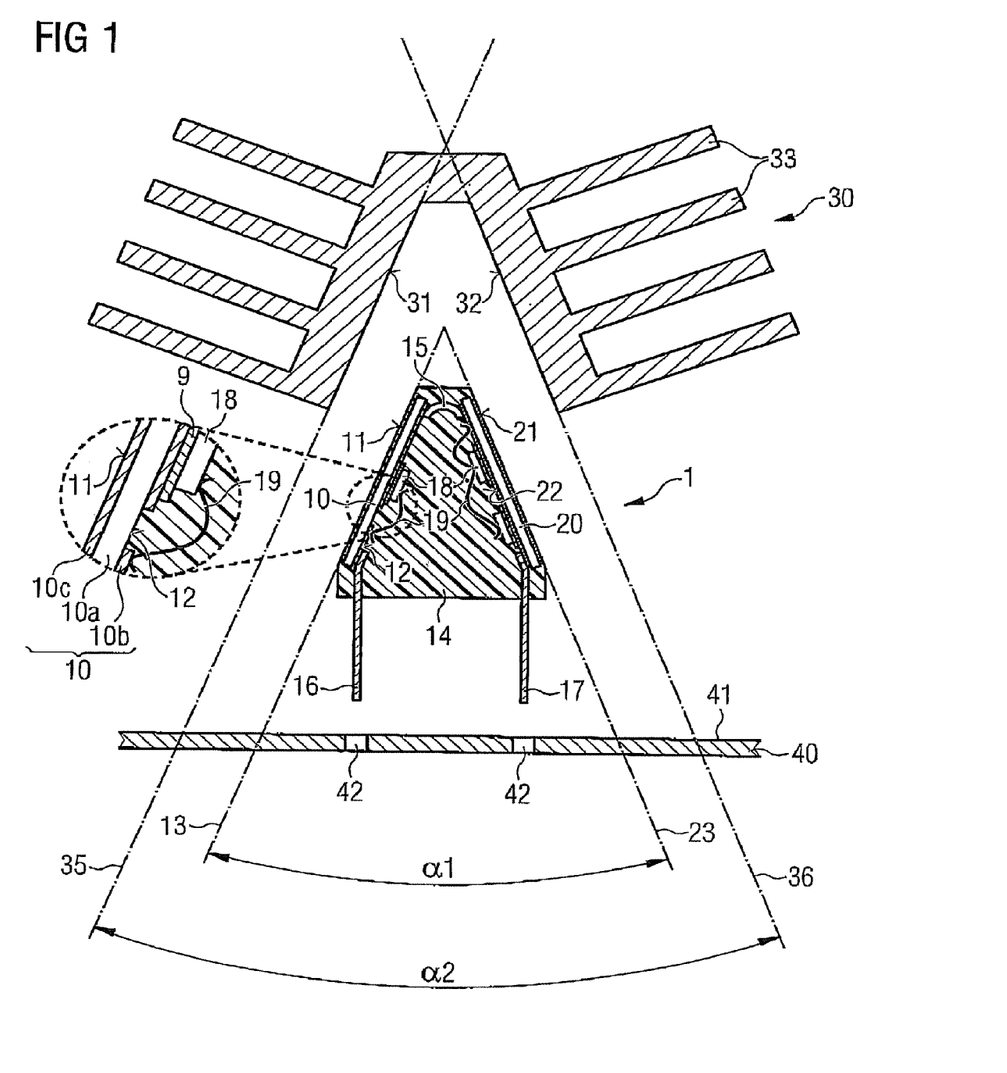
FIG. 1 illustrates cross sectional views of embodiments of a power semiconductor arrangement including a semiconductor module.

In one embodiment illustrated in FIG. 1, a semiconductor module 1 is provided which includes a first carrier 10 and a second carrier 20. The first carrier 10 includes a first cooling surface 11 and a first component side 12 which is arranged opposite the first cooling surface 11. The second carrier 20 includes a second cooling surface 21 and a second component side 22 which is arranged opposite the second cooling surface 21. The first cooling surface 11 is arranged in a first plane 13, the second cooling surface 21 is arranged in a second plane 23. The first plane 13 is at an angle different from 0° relative to the second plane 23.

In another embodiment, a semiconductor arrangement is provided. The semiconductor arrangement includes a semiconductor module and a heat sink. The semiconductor module includes a first carrier with a first cooling surface and a first component side which is arranged opposite the first cooling surface, and a second carrier with a second cooling surface and a second component side which is arranged opposite the second cooling surface. At least one of the first component side and the second component side is equipped with a semiconductor chip. The first cooling surface is arranged in a first plane, the second cooling surface is arranged in a second plane. The first plane and the second plane include a first angle which is different from 0°.

The heat sink includes a first contact surface and a second contact surface. The first contact surface is arranged in a third plane, the second contact surface is arranged in a fourth plane. The third plane and the fourth plane include a second angle which is equal to the first angle.

A method for producing a semiconductor module is provided. In the method, a first carrier and a second carrier are provided. The first carrier includes a first component side and a first cooling surface which is arranged in a first plane opposite the first component side. The second carrier includes a second component side and a second cooling surface which is arranged in a second plane opposite the second component side. A first electric circuit is formed on the first component side, and a second electric circuit is formed on the second component side. The first carrier and the second carrier are arranged relative to one another such that the first plane and the second plane include an angle of less than 180°.

In one embodiment, a method for producing a semiconductor arrangement is provided. In the method, a first carrier and a second carrier are provided. The first carrier includes a first component side and a first cooling surface which is arranged in a first plane opposite the first component side. The second carrier includes a second component side and a second cooling surface which is arranged in a second plane opposite the second component side. A first electric circuit is formed on the first component side, and a second electric circuit is formed on the second component side. The first carrier and the second carrier are arranged relative to one another such that the first plane and the second plane include an angle of less than 180°. A heat sink with a first contact surface and with a second contact surface is provided, wherein the first contact surface is arranged in a third plane, the second contact surface is arranged in a fourth plane, and the third plane and the fourth plane include a second angle which is equal to the first angle. Between the first cooling surface and the first contact surface and between the second cooling surface and the second contact surface thermal contacts are made.

FIG. 1 is a cross sectional view of a power semiconductor arrangement which includes a semiconductor module 1 and a heat sink 30. The semiconductor module 1 includes a first carrier 10 and a second carrier 20. The first carrier 10 includes a first component side 12, and a first cooling surface 11 opposite the first component side 12. On the first component side 12, a first electric circuit with electric components 18, which produce waste heat, is arranged. Accordingly, the second carrier 20 includes a second component side 22, and a second cooling surface 12 opposite the second component side 22. On the second component side 22, a second electric circuit is arranged. On the component sides 12, 22, electric components producing waste heat, e.g., semiconductor chips 18, are arranged.

The first cooling surface 11 is arranged in a first plane 13, the second cooling surface 21 is arranged in a second plane 23, wherein the first plane 35 and the second plane 36 include an angle α1 which is greater than 0° and therefore is also different from 180°. This means that the first and second component sides 12, 22 face towards the interior of the semiconductor module 1. Accordingly, the first and second cooling surface 11, 21 form outer surfaces of the semiconductor module 1 and allow for thermally contacting a heat sink 30. For instance, as lower limit the angle α1 may be greater than 0° or greater than 10°. On the other hand, as upper limit the angle α1 may be, for instance, less than 180° or less than 170° or less than 90° or less than 60° or less than 30°.

In one embodiment (see the enlarged circular area of FIG. 1), the first carrier 10 and/or the second carrier 20 may include a dielectric substrate 10a, which may be, for instance, be made of ceramics, e.g., of aluminum oxide or of aluminum nitride. Further, on the respective component side 12, 22, the first carrier 10 and/or the second carrier 20 may include a component side metallization 10b, which may be structured to form conductive paths and/or to form lands for mounting electric components, e.g., the semiconductor chip 18. In the enlarged circular area of FIG. 1, the semiconductor chip 18 is soldered by use of a solder 9 to a land formed in the component side metallization 10b.

In one embodiment, the first carrier 10 and/or the second carrier 20 may include a cooling surface metallization 10c which is arranged opposite the component side metallization 10b of the respective carrier 10, 20. In order to realize the first and the second electric circuit, the respective electric components are electrically connected by use of the component side metallizations, and optionally by use of bond wires 19.

For example, the first carrier 10 and/or the second carrier 20 may be a DCB-substrate (DCB=direct copper bonding), a AMB-substrate (AMB=active metal brazing), or a PCB (PCB=printed circuit board).

In one or more embodiments, the first carrier 10 and/or the second carrier 20 may be a conductive lead frame, e.g., made of metal.

As further illustrated in FIG. 1, the first electric circuit formed on the first carrier 10 and the second electric circuit formed on the second carrier 20 may be electrically connected by use of an electric connection 15, which may be designed as flex connector. Such a flex connector includes one or more flexible conductive lines which are laminated together with a flexible dielectric film so as to form a flexible composite.

Together with a pottant 14, the first carrier 10 and the second carrier 20 form a housing of the semiconductor module 1. In order to allow for electrically connecting the semiconductor module 1 to other electric components, e.g., to a power supply or to an electric load, a semiconductor module 1 generally includes external leads 16, 17 which are electrically connected to the first and/or to the second electric circuit.

The heat sink 30 includes a first contact surface 31 which is arranged in a third plane 35, and a second contact surface 32 which is arranged in a fourth plane 36. The third plane 35 and the fourth plane 36 include a second angle α2 which is equal to the first angle α1.

The heat sink 30 illustrated in FIG. 1 is steep and made in one piece which allows for easily attaching the heat sink 30 to the semiconductor module 1 such that the first cooling surface 11 gets into thermal contact with the first contact surface 31 and that the second cooling surface 12 gets into thermal contact with the second contact surface 32.

In one or more embodiments, the heat sink 30 may be formed from two or more independent parts.

Together with the heat sink 30, the semiconductor module 1 forms a semiconductor arrangement which may be attached to a circuit board 40. In FIG. 1, the circuit board 40 is a PCB with a top metallization 41, and with metallized through holes 42 which are arranged corresponding to the arrangement of the external leads 16, 17. After inserting the external leads 16, 17 through the corresponding through holes 42, the external leads 16, 17 can be soldered to the metallization of the through holes and thereby be electrically connected to conductive lines formed in the top metallization 41 of the circuit board 40.

The order of attaching the heat sink 30 to the semiconductor module 1 and of attaching the semiconductor module 1 to the circuit board 40 may be chosen in an arbitrary manner. For example, the heat sink 30 may be attached to the semiconductor module 1 to form a semiconductor arrangement which is attached to the circuit board 40. Likewise, it is possible to attach the semiconductor module 1 to the circuit board 40 and then to attach the heat sink 30 to the semiconductor module 1.

Figure 2:
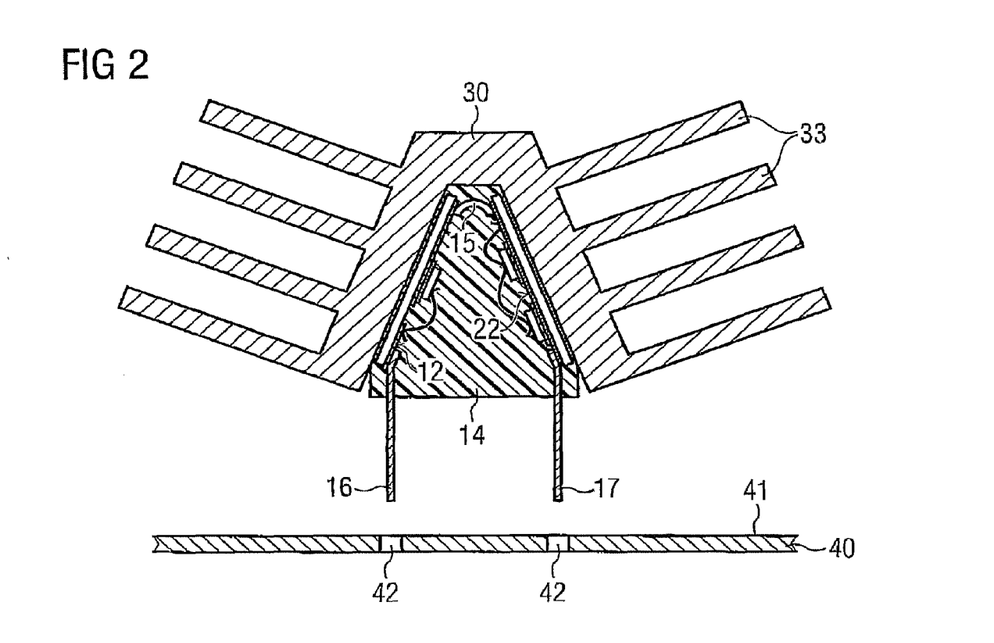
FIG. 2 illustrates one embodiment of the semiconductor arrangement of FIG. 1 in which the cooling surfaces of the semiconductor module are in thermal contact with the contact surfaces of a heat sink.
Figure 3:
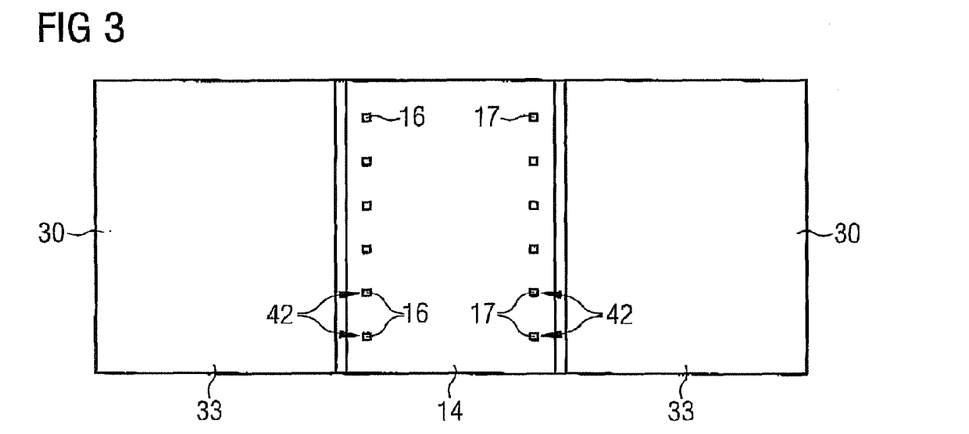
FIG. 3 illustrates a bottom view of one embodiment of the semiconductor arrangement of FIG. 2 with the semiconductor module soldered to the circuit board. The semiconductor module includes a number of external leads which are arranged in two parallel lines.

FIG. 3 is a bottom view of the semiconductor arrangement of FIG. 2 with the semiconductor module 1 soldered to the circuit board 40. The semiconductor module 1 includes a number of external leads 16, 17 which are arranged in two parallel lines (DIL=dual in line). The external leads 16 are electrically connected to the first carrier 10 and form a first line, the external leads 17 are electrically connected to the second carrier 20 and form a second line.

Figure 4:
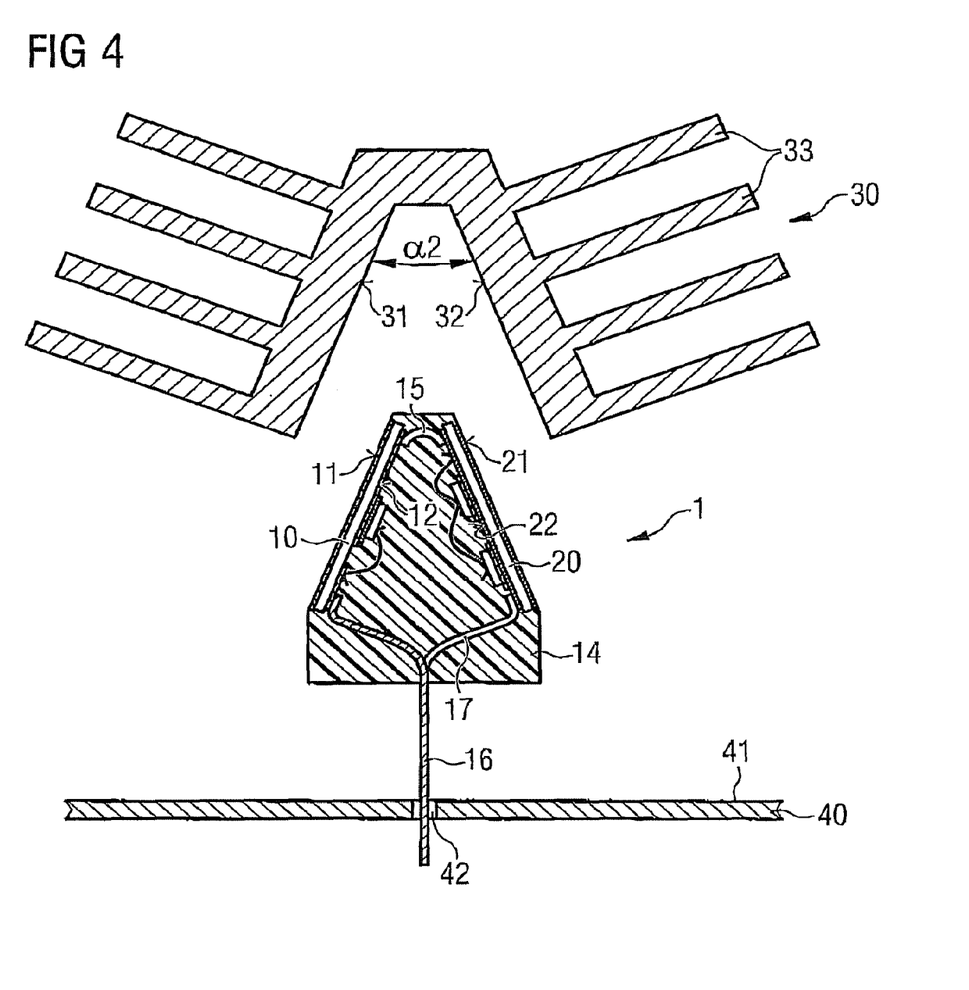
FIG. 4 illustrates a cross section through one embodiment of a semiconductor arrangement in which the semiconductor module includes a number of external leads which are arranged a single line.

In one embodiment illustrated in FIG. 4, the external leads 16, 17 are arranged in one single line (SIL=single in line).

Figure 5:
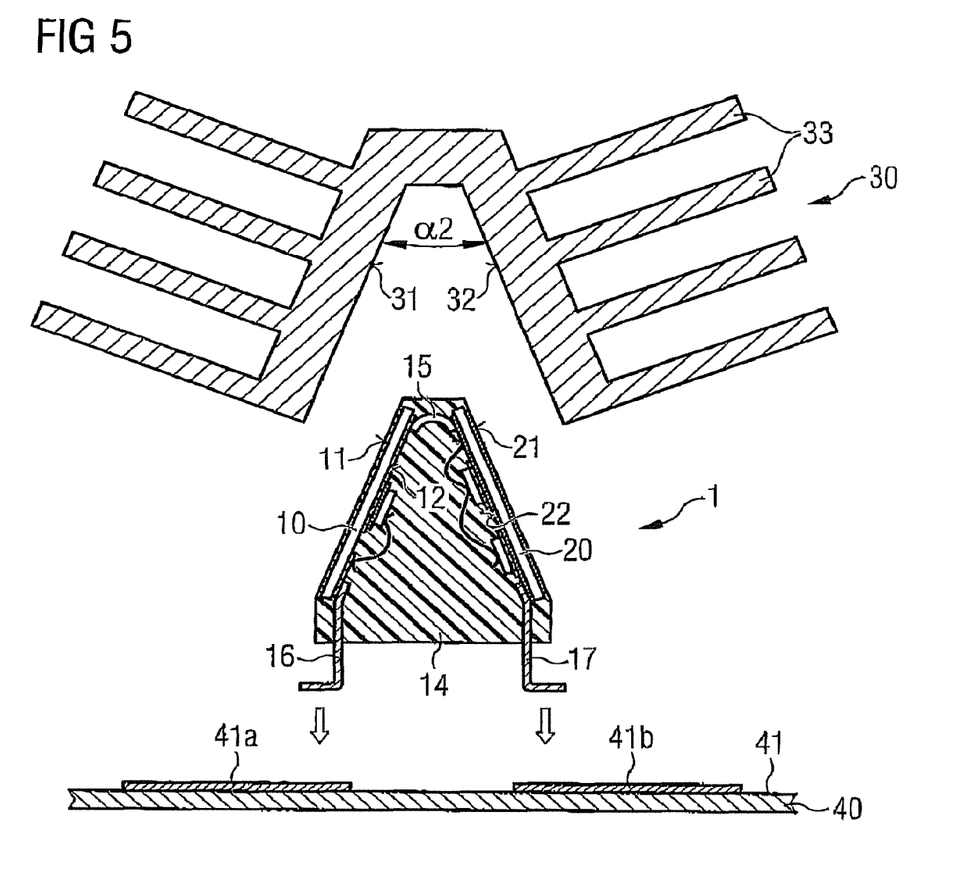
FIG. 5 illustrates a cross section through one embodiment of a semiconductor arrangement in which the semiconductor module includes a number of external leads which are formed as SMD-contacts.

In FIG. 4 and also in the following FIGS. 5, 7 and 8, the first cooling surface 11 and the second cooling surface 21 are arranged in a first plane 13 and in a second plane 36, respectively, as illustrated in FIG. 1, and include an angle α1 which is greater than 0° but equal to the angle α2 defined by the relative orientation of the first and second contact surfaces 31 and 32, respectively, of the appropriate heat sink 30. However, for reason of clarity, the angle α1 is not depicted in FIGS. 4, 5, 7 and 8.

In FIGS. 1, 2 and 4, the external leads 16, 17 are designed as solderable leads with straight ends. In one embodiment, the external leads 16, 17 may be designed as SMD-contacts as illustrated in FIG. 5. The external leads 16, 17 may be soldered to corresponding lands 41a, 41b formed in the top metallization 41 of the circuit board 40.

Figure 6:
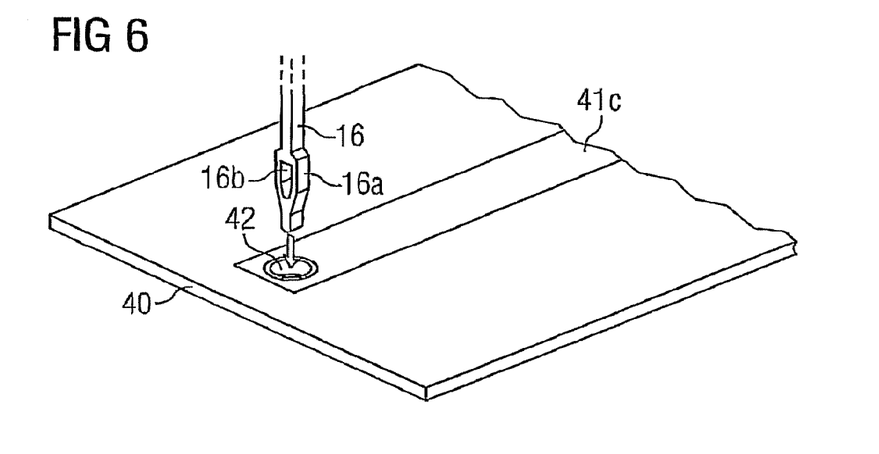
FIG. 6 illustrates a 3-dimensional perspective view of one embodiment of an external lead of a semiconductor module prior to making contact with the metallization of a circuit board. The lead is formed as press-fit contact.

In one or more embodiments, the external contacts 16, 17 may be formed as press-fit contacts as illustrated in FIG. 6 which illustrates the end of an external lead 16. The external lead 16 includes an expanded section 16a with an opening or a depression 16b. In the area of the expanded section 16a, the external lead 16 has a width which is greater than the diameter of a through hole 42 formed in the area of a conductive line 41c, which is a part of the top metallization of the circuit board 40. When being pressed into the through hole 42, the expanded section 16a is compressed and therefore fits tight in the metallized through hole 42 to form a good electric contact with the conductive line 41c.

In the previous Figures, the heat sink 30 has been described to be attached to the semiconductor module 1. However, the heat transfer from the semiconductor module 1 to the heat sink 30 can be improved by pressing the heat sink 30, i.e. its first and second contact surface 31 and 32, respectively, against the corresponding cooling surfaces 11 and 21, respectively, of the semiconductor module 1, using a mechanism for generating an appropriate contact force.

Figure 7:
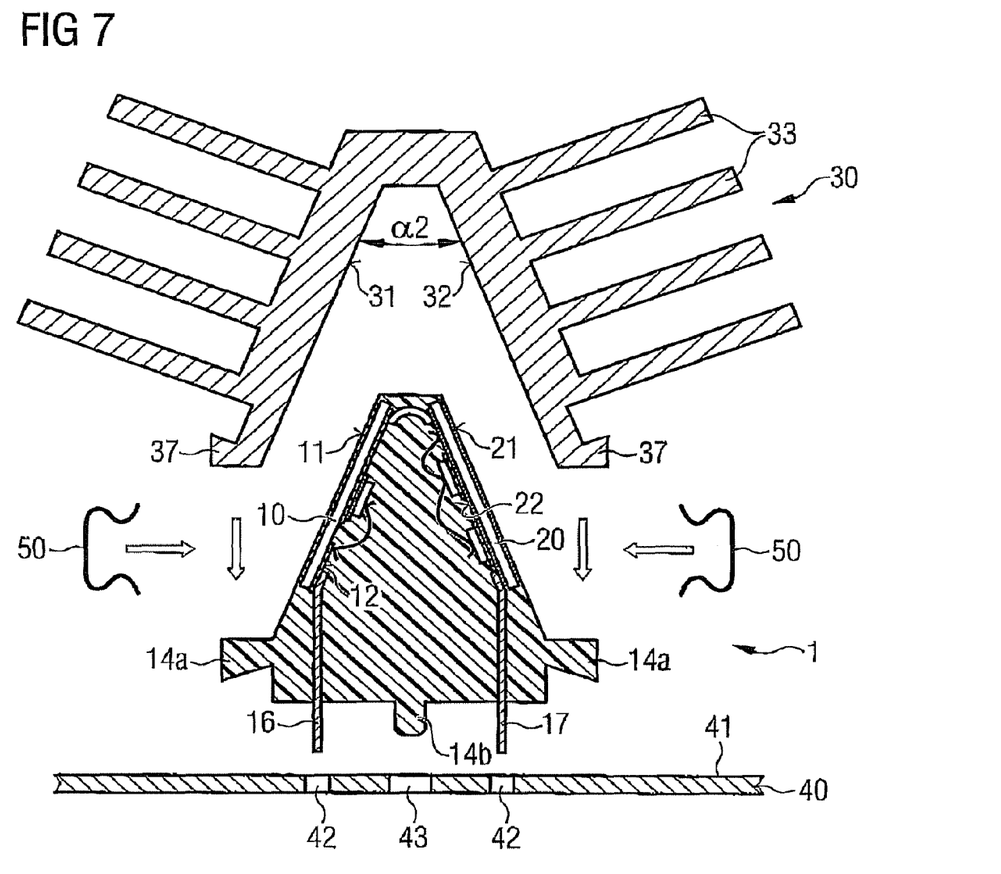
FIG. 7 illustrates a cross section through one embodiment of a semiconductor arrangement in which each the semiconductor module and the heat sink include a detent for being interlocked by use of a spring clip.

As illustrated in FIG. 7, one mechanism to generate such contact force is to use one or more spring clips 50 which are snapped pairwise onto detents 37 of the heat sink 30 and onto detents 14a of the semiconductor module 1 which correspond to the detents 37 of the heat sink 30. Prior to snapping the spring clips 50 onto the detents 37 and 14a, the heat sink 30 is attached to the semiconductor module 1. In other embodiments, some or all of the spring clips 50 may also be used for joining the arrangement including the semiconductor module 1 and the heat sink 30 with the circuit board 40.

As also illustrated in FIG. 7, the semiconductor module 1 may comprise one or more alignment studs 14b which fit in corresponding openings 43 formed in the circuit board 40, thereby serving for correctly aligning the semiconductor module 1 and the external leads 16, 17 relative to the circuit board 40. Such studs 14b may, e.g., be formed integrally with the mould 14.

Figure 8:
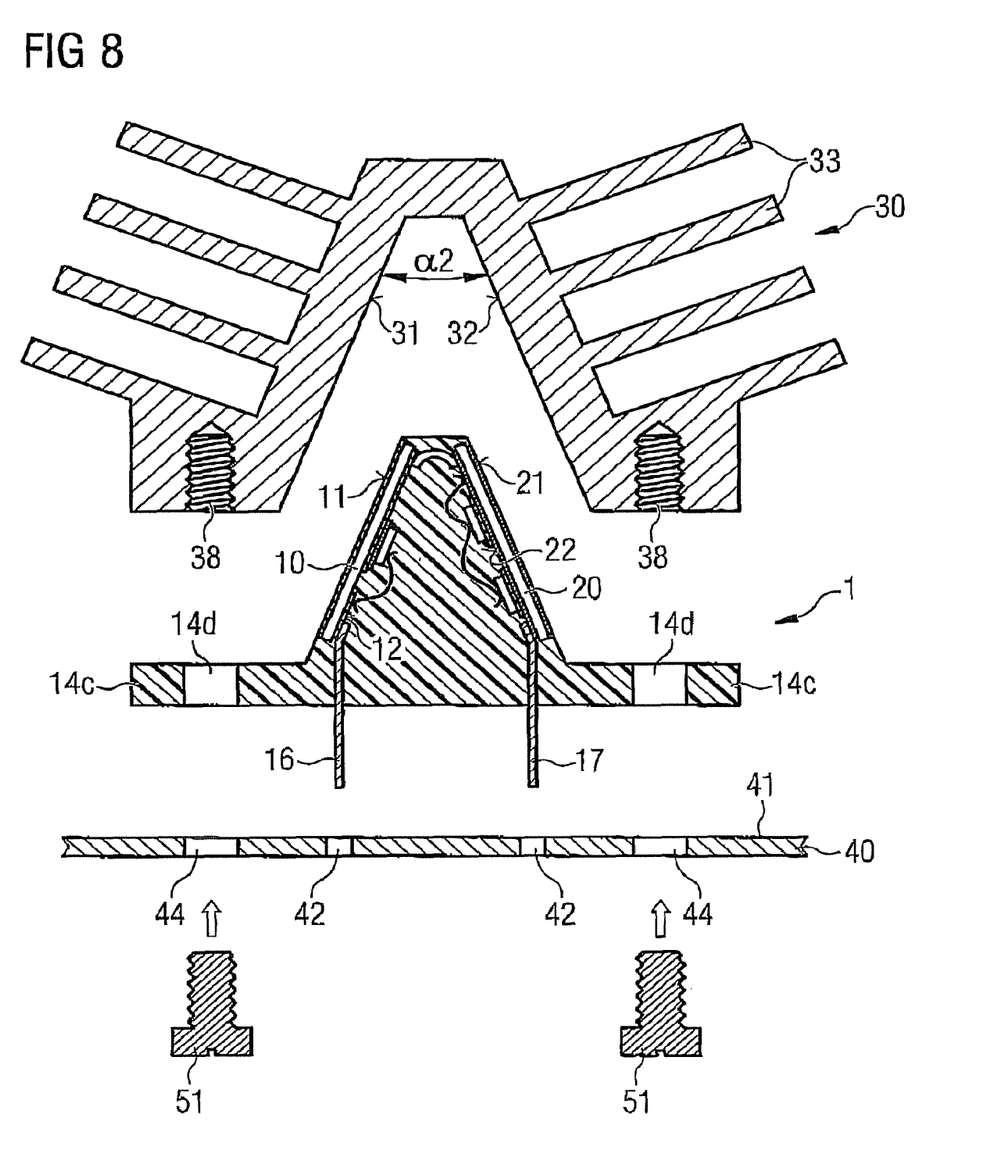
FIG. 8 illustrates a cross section through one embodiment of a semiconductor arrangement in which the semiconductor module includes assembly openings for screwing the module together with the heat sink by use of screws. The heat sink includes threaded holes which are arranged corresponding to the assembly openings.
Figure 9:
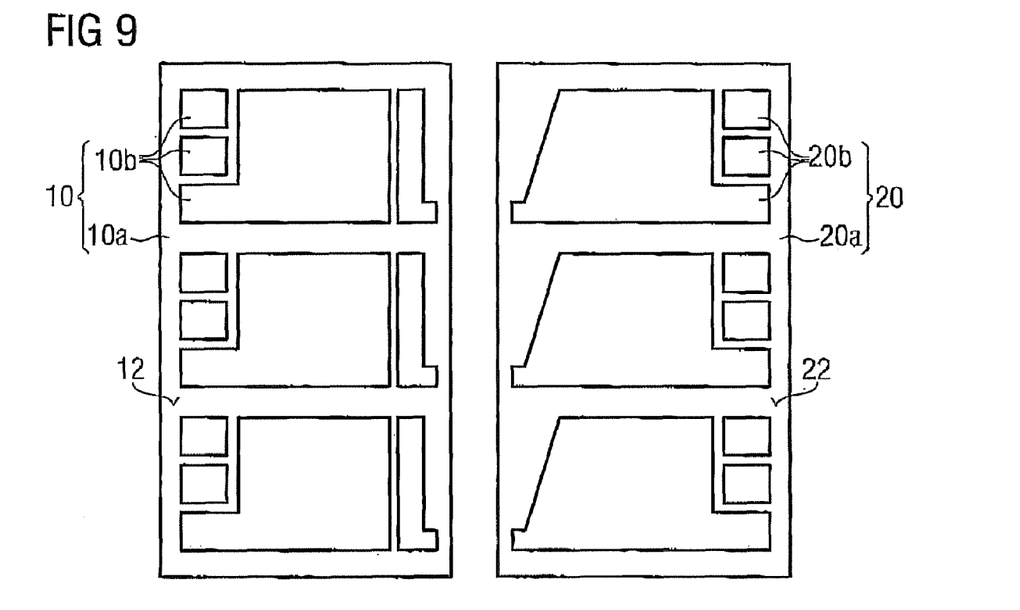
FIGS. 9 to 20 illustrate different processes for producing a semiconductor arrangement.
Figure 10:
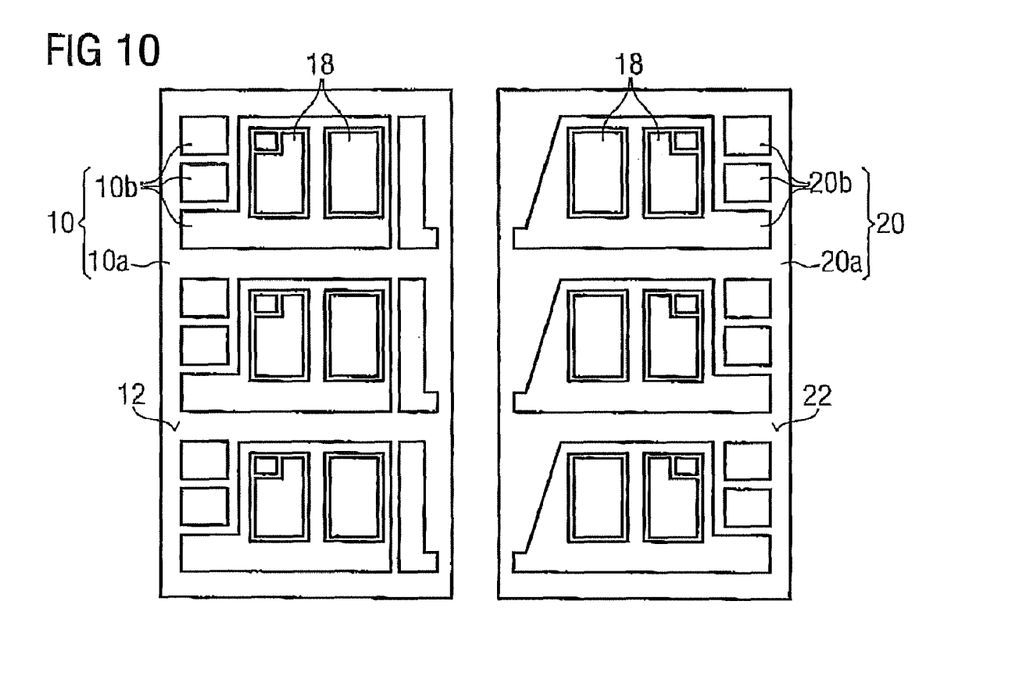
Figure 11:
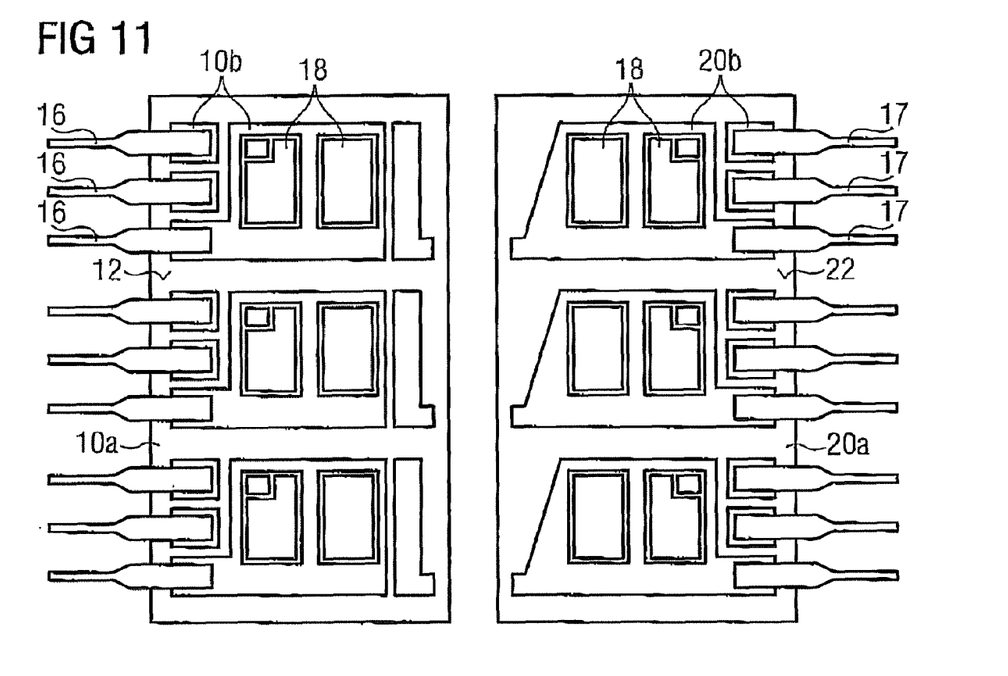

In one embodiment illustrated in FIG. 8, screws 51 provide a mechanism configured for generating an appropriate contact force between the heat sink 33 and the semiconductor module 1. Different from the spring clips 50 illustrated in FIG. 7, the screws 51 additionally serve for mounting the heat sink 30 and the semiconductor module 1 on the circuit board 40. In one embodiment, the screws 51 are inserted in assembly openings 44 of the circuit board 40, and in assembly openings 14d which are formed in flanges 14c of the mould 14, and then screwed into threaded holes 38 formed in the heat sink 30.

In one embodiment or in addition to clipping and/or screwing together the semiconductor module 1 and the heat sink 30, the heat sink 30 may be glued to the semiconductor module 1 by gluing the first cooling surface 11 to the first contact surface 31, and/or by gluing the second cooling surface 21 to the second contact surface 32.

As described above, attaching the heat sink 30 to the semiconductor module 1 causes a good thermal contact between the first cooling surface 11 and the first contact surface 31, and between the second cooling surface 21 and the second contact surface 32. In order to improve the heat transfer, a heat-conductive paste or a heat conductive film may be arranged between the first cooling surface 11 and the first contact surface 31, and/or between the second cooling surface 21 and the second contact surface 32.

FIGS. 9 to 20 illustrate different processes of a method for producing a semiconductor module 1. As can be seen from FIG. 9, a first carrier 10 with first component side 12 and a second carrier 20 with a second component side 22 are provided. Each of the first carrier 10 and the second carrier 20 includes a dielectric substrate 10a and 20a, respectively, with structured metallizations 10b and 20b, respectively.

Depending on the properties of the semiconductor module to be produced, at least one of the first component sides 12, 22 is populated with one or more semiconductor chips 18, e.g., IGBTs, MOSFETs, Diodes, etc., and optionally with other electric components, e.g., by soldering or by electrically conductive gluing. The result can be seen in FIG. 10. In one embodiment illustrated in FIG. 11, external leads 16, 17, e.g., formed as parts of a lead frame, may be soldered, welded ore electrically conductive glued to respective lands formed in the metallizations 10b, 20b. During soldering, welding ore electrically conductive gluing, some or all of the leads 16, 17 may be formed in one piece (the lead frame) and be separated later.

Figure 12:
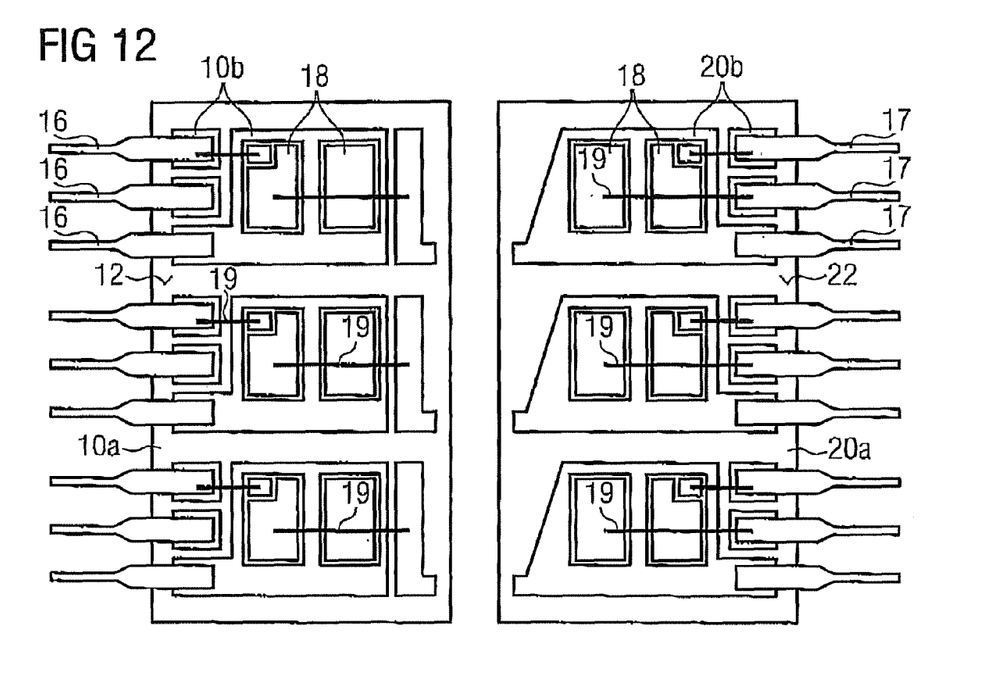

Then, as illustrated in FIG. 12, to complete the wiring of the electric circuits to be formed on the component sides 12, 22, in one embodiment to electrically connect also the upper sides of the semiconductor chips 18, bond wires 19 and/or (not illustrated) contact bows may be attached.

Figure 13:
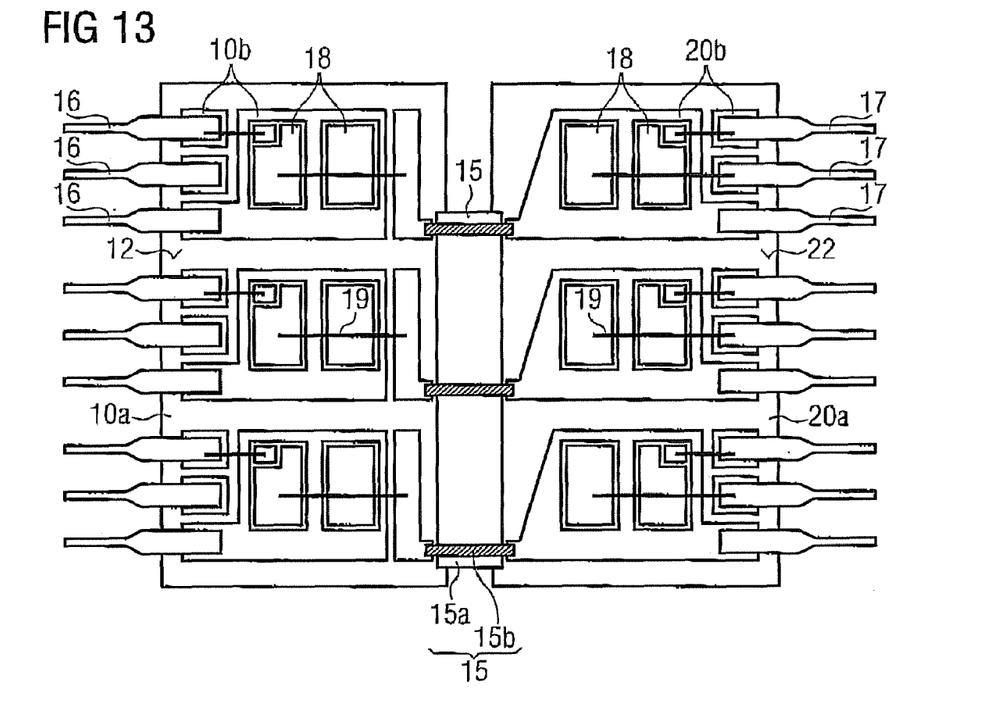
Figure 14:
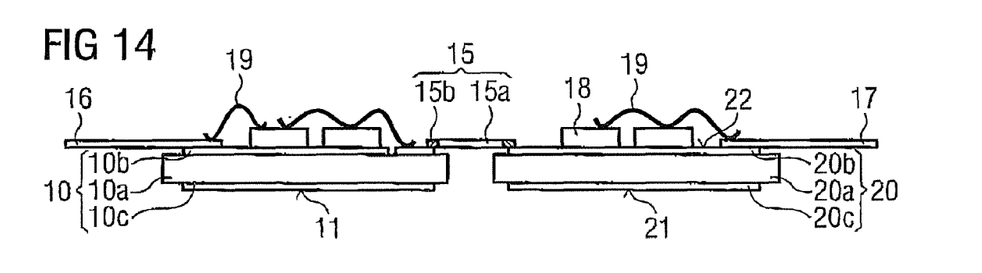

Further, prior to or after populating and/or attaching bond wires 19 and/or contact bows to the first carrier 10 and/or to the second carrier 20, the first electric circuit formed on the first component side 12 and the second electric circuit formed on the second component side 22 may be electrically connected by use of an electric connection 15, which may be designed as flex connector. Such a flex connector includes one or more flexible conductive lines 15b which are laminated together with one or some layers of a flexible dielectric film 15a so as to form a flexible composite. The result is illustrated in FIG. 13. The conductive lines 15b may, e.g., be soldered or welded to corresponding lands formed in the metallizations 10b, 20b. In a side view of the arrangement of FIG. 13, FIG. 14 illustrates also the metallizations 10c and 20c which are arranged opposite the metallizations 10b and 20b, respectively.

In an optional further process, the external contacts 16, 17, which may be arranged substantially in a plane, may be bent over towards the component sides 12, 22 about an angle β which may be, e.g., half the angle α1 of the semiconductor module to be produced.

Figure 15:
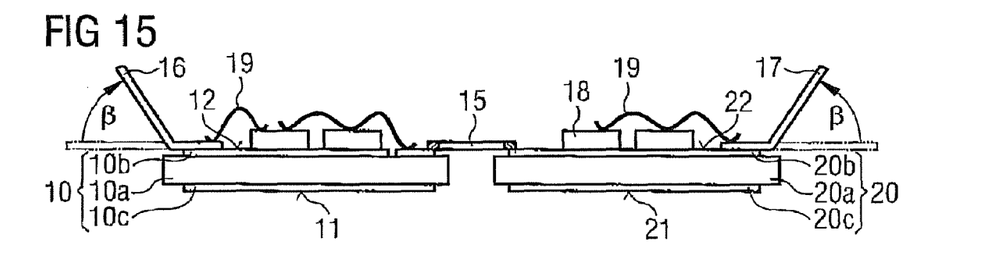

FIG. 15 illustrates the result after bending over the external contacts 16, 17.

Figure 16:
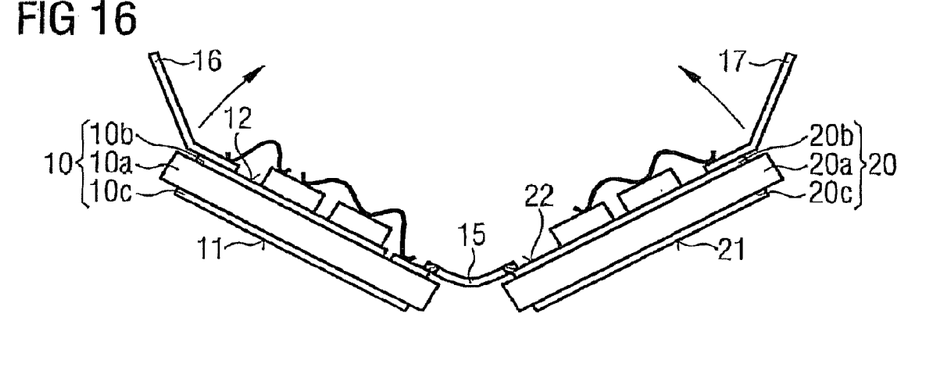
Figure 17:
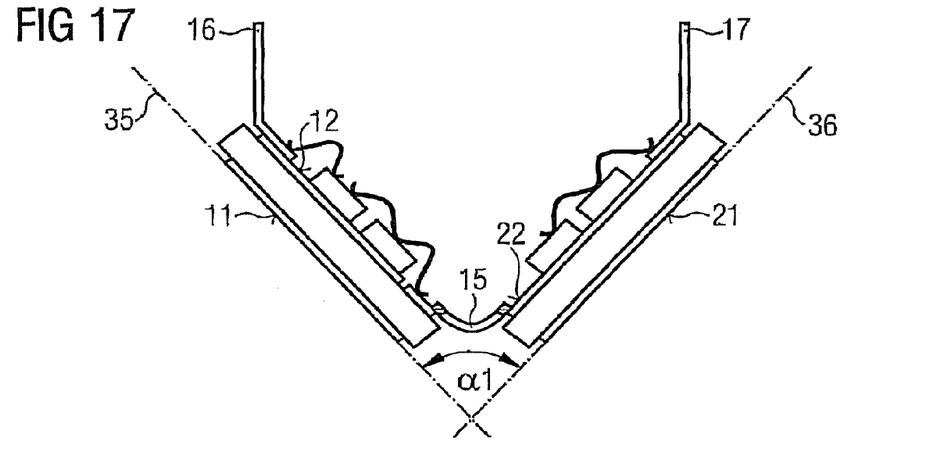

As illustrated in FIGS. 16 and 17, the populated first carrier 10 and the populated second carrier 20 are flexibly connected with the flex connector 15 which allows for arranging the first carrier 10 and the second carrier 20 relative to one another such that the first plane 35 of the first cooling surface 11 and the second plane 36 of the second cooling surface 21 include a pre-defined angle α1 which is different from 0°, and different from 180°.

Figure 18:
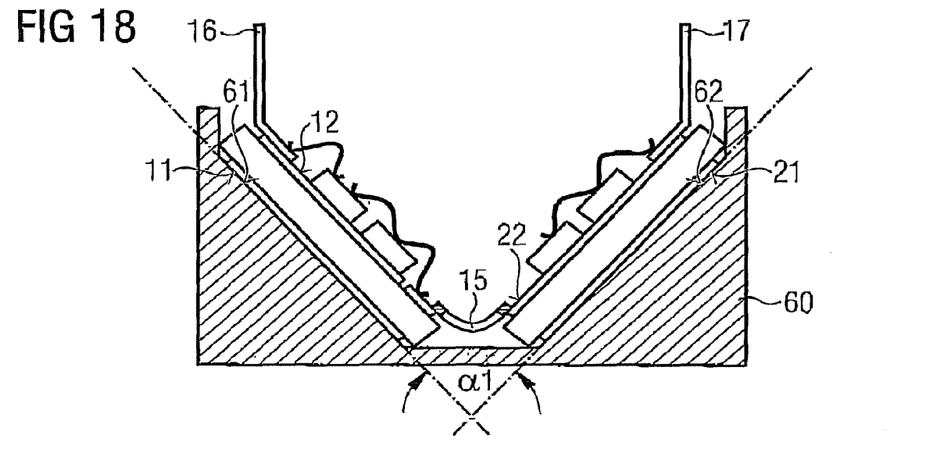

As illustrated in FIG. 18, one way to obtain the pre-defined angle α1 is to insert the arrangement illustrated in FIGS. 15 to 17 in a cast 60 with stopper surfaces 61 and 62, respectively, which also include the pre-defined angle α1, such that the first cooling surface 11 contacts the stopper surface 61, and that the second cooling surface 12 contacts the stopper surface 62.

Figure 19:
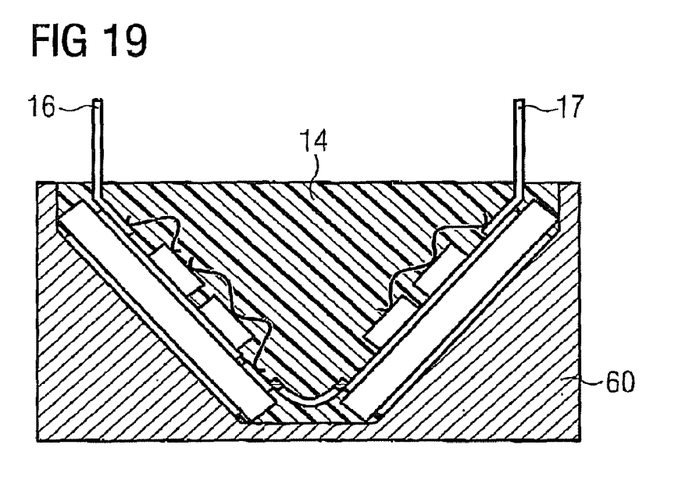
Figure 20:
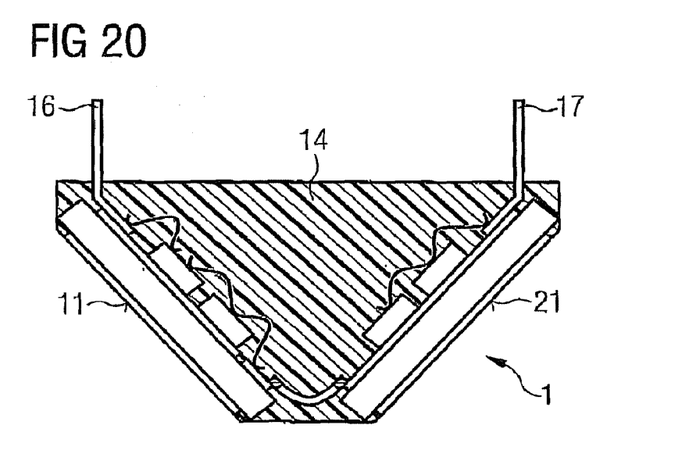

Then, the arrangement is moulded with a mould 14 (FIG. 19). FIG. 20 illustrates the finished semiconductor module 1 after removing it from the cast 60.

It is noted that device features or method processes that have been explained in connection with one example may be combined with device features or method processes of other examples also in those cases in which such combinations have not explicitly been explained. In one embodiment, features or method processes mentioned in a claim may be combined with features or method processes mentioned in any one or more other claims within the same embodiment, as long as the respective features or method processes do not exclude each other.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor module comprising:
    a first carrier with a first cooling surface and with a first component side which is arranged opposite the first cooling surface; and
    a second carrier with a second cooling surface and with a second component side which is arranged opposite the second cooling surface;
    the first cooling surface is arranged in a first plane;
    the second cooling surface is arranged in a second plane; and
    the first plane is at an angle different from 0° relative to the second plane,
    wherein the angle between the first plane and the second plane is less than 170°.

2. The semiconductor module of claim 1, comprising wherein first cooling surface and the second cooling surface form outer surfaces of the semiconductor module.

3. The semiconductor module of claim 1, comprising wherein the first carrier is a printed circuit board or a lead frame or a metallized ceramic substrate.

4. The semiconductor module of claim 1, comprising:
    a heat sink configured in thermal communication with the first cooling surface and the second cooling surface.

5. The semiconductor module of claim 1, wherein the first carrier comprises a first electric circuit;
    the second carrier comprises a second electric circuit; and
    the first electric circuit and the second electric circuit are electrically connected by a bond wire or by a flex connector.

6. The semiconductor module of claim 1, comprising at least one external lead which is a part of a lead frame.

7. The semiconductor module of claim 1, comprising at least one external lead which is formed as a solderable lead or as a press-fit connector or as an SMD connector.

8. The semiconductor module of claim 1, comprising a number of external leads which are arranged in a single line or in two parallel lines.

9. The semiconductor module of claim 1, comprising a molded housing.

10. The semiconductor module of claim 1, wherein the molded housing comprises plastic material which contacts the first component side and the second component side, and which encapsulates electric components which are arranged on the first component side and/or on the second component side.

11. A semiconductor arrangement comprising
    a semiconductor module with a first carrier with a first cooling surface and with a first component side which is arranged opposite the first cooling surface; and
    a second carrier with a second cooling surface and with a second component side which is arranged opposite the second cooling surface;
    wherein at least one of the first component side and the second component side is equipped with a semiconductor chip;
    the first cooling surface is arranged in a first plane;
    the second cooling surface is arranged in a second plane; and
    the first plane and the second plane include a first angle which is different from 0°;
    a heat sink comprising a first contact surface and a second contact surface, wherein
    the first contact surface is arranged in a third plane;
    the second contact surface is arranged in a fourth plane; and
    the third plane and the fourth plane include a second angle substantially equal to the first angle, and
    wherein the angle between the first plane and the second plane is less than 170°.

12. The semiconductor arrangement of claim 11, comprising wherein the first cooling surface is in thermal contact with the first contact surface and wherein the second cooling surface is in thermal contact with the fourth surface.

13. The semiconductor arrangement of claim 11, comprising wherein a heat-conductive paste or a heat conductive film is arranged between the first cooling surface and the first contact surface; and/or between the second cooling surface and the second contact surface.

14. The semiconductor arrangement of claim 11, comprising wherein first cooling surface and the second cooling surface form outer surfaces of the semiconductor module.

15. A method for producing a semiconductor module comprising:
    providing a first carrier with a first component side and with a first cooling surface which is arranged in a first plane opposite the first component side;
    providing a second carrier with a second component side and with a second cooling surface which is arranged in a second plane opposite the second component side;
    forming a first electric circuit on the first component side;
    forming a second electric circuit on the second component side; and
    arranging the first carrier and the second carrier relative to one another such that the first plane and the second plane are at an angle of less than 180°.

16. The method of claim 15, comprising arranging the first plane and the second plane are arranged at an angle of less than 170°.

17. The method of claim 15, comprising forming an electrical connection between the first electric circuit and the second electric circuit.

18. A method for producing a semiconductor arrangement comprising:
    providing a first carrier with a first component side and with a first cooling surface which is arranged in a first plane opposite the first component side;
    providing a second carrier with a second component side and with a second cooling surface which is arranged in a second plane opposite the second component side;

forming a first electric circuit on the first component side;

forming a second electric circuit on the second component side;

arranging the first carrier and the second carrier relative to one another such that the first plane and the second plane include a first angle of less than 180°;

providing a heat sink with a first contact surface and with a second contact surface, wherein the first contact surface is arranged in a third plane, the second contact surface is arranged in a fourth plane, and the third plane and the fourth plane include a second angle substantially equal to the first angle; and making thermal contacts between the first cooling surface and the first contact surface and between the second cooling surface and the second contact surface.

19. The method of claim 18, comprising forming an electrical connection between the first electric circuit and the second electric circuit.

20. The method of claim 18, wherein the semiconductor module comprises at least one lead, comprising:

providing a circuit board;

arranging the semiconductor module between the heat sink and the circuit board; and electrically connecting the at least one lead with the circuit board.

21. The method of claim 18, wherein making thermal contacts comprises:

gluing the first cooling surface and the first contact surface and gluing the first contact surface and the second contact surface;

screwing together the heat sink and the circuit board; and mounting the heat sink to the semiconductor module by use of a retaining clip.

* * * * *